United States Patent
Mecreant et al.

(10) Patent No.: US 10,613,127 B2
(45) Date of Patent: Apr. 7, 2020

(54) DETERMINING THE FREQUENCY OF AN ALTERNATING SIGNAL

(71) Applicant: Schneider Electric Industries SAS, Rueil Malmaison (FR)

(72) Inventors: Julien Mecreant, Seyssinet Pariset (FR); Christophe Ghafari, Echirolles (FR); Bertrand Raison, St Martin d'Heres (FR); Raphael Caire, Grenoble (FR)

(73) Assignee: Schneider Electric Industries SAS, Rueil Malmaison (FR)

( * ) Notice: Subject to any disclaimer, the term of this patent is extended or adjusted under 35 U.S.C. 154(b) by 222 days.

(21) Appl. No.: 15/670,602

(22) Filed: Aug. 7, 2017

(65) Prior Publication Data

US 2018/0059154 A1    Mar. 1, 2018

(30) Foreign Application Priority Data

Aug. 24, 2016  (FR) ..................... 16 57892

(51) Int. Cl.
*H02H 3/46* (2006.01)
*G01R 23/00* (2006.01)
(Continued)

(52) U.S. Cl.
CPC ....... *G01R 23/005* (2013.01); *G01R 19/2506* (2013.01); *G01R 23/02* (2013.01);
(Continued)

(58) Field of Classification Search
CPC ...... G01R 23/005; G01R 23/02; G01R 23/12; G01R 23/15; G01R 19/2506; H02H 3/46
See application file for complete search history.

(56) References Cited

U.S. PATENT DOCUMENTS

| 4,928,251 A | 5/1990 | Marzalek et al. |
| 2009/0254291 A1 | 10/2009 | Benmouyal |
| 2014/0032143 A1* | 1/2014 | Luo .................... G01R 19/2513 702/64 |

FOREIGN PATENT DOCUMENTS

| CN | 102135567 A | 7/2011 |
| CN | 104849545 A | 8/2015 |

(Continued)

OTHER PUBLICATIONS

French Preliminary Search Report dated Apr. 11, 2017 in French Application 1657892, filed on Aug. 24, 2016 (with English Translation of Categories of cited documents).

(Continued)

*Primary Examiner* — Toan M Le
(74) *Attorney, Agent, or Firm* — Oblon, McClelland, Maier & Neustadt, L.L.P.

(57) ABSTRACT

A method determines the frequency of an alternating input signal includes storing the input signal, sampling the input signal at a first sampling frequency, a first calculation and a first angular comparison of two phasors representing the input signal at two respective instants, as a function of the input signal sampled at the first sampling frequency, estimating the frequency of the input signal, and searching for a modification of frequency of the input signal. When a modification is detected the method includes, determining a second sampling frequency, sampling the stored input signal with the second sampling frequency, a second calculation and a second angular comparison of two phasors representing the input signal, at two respective instants, as a function of the input signal sampled at the second sampling frequency and of the stored input signal sampled at the second sampling frequency, and estimating the frequency of the input signal.

12 Claims, 6 Drawing Sheets

(51) Int. Cl.
 G01R 23/12 (2006.01)
 G01R 19/25 (2006.01)
 G01R 23/02 (2006.01)
 G01R 23/15 (2006.01)
(52) U.S. Cl.
 CPC ............... *G01R 23/12* (2013.01); *H02H 3/46* (2013.01); *G01R 23/15* (2013.01)

(56) References Cited

FOREIGN PATENT DOCUMENTS

EP   1 847 838 A1   10/2007
TW   201342765 A    10/2013

OTHER PUBLICATIONS

Daqing Hou "Relay Element Performance During Power System Frequency Excursions", 61$^{st}$ Annual Conference for Protective Relay Engineers, 2008, 14 pages.

Gabriel Benmouyal, et al. "Concurrent Implementation of 81 Frequency Elements Together With Frequency Tracking in Protective Relays: Issues and Solutions", 36$^{th}$ Annual Western Protective Relay Conference, 2009, 15 pages.

CN 102 135 567 A (Shenzhen Yestuned Industry Co Ltd) Jul. 27, 2011 (Jul. 27, 2011) * abrégé; figure 1 * * alinéa [0012]—alinéa [0033] *.

CN 104 849 545 A (Xuji Group Co Ltd; Xuji Electric Co Ltd; Xuchang XJ Software Technolog) Aug. 19, 2015 (Aug. 19, 2015) * abrégé; figures 1,5 *

& US 2016/320437 A1 (Wang Li [CN] et al) Nov. 3, 2016 (Nov. 3, 2016) * alinéas [0006]-[0024], [0042]-[0061], [0065]-[0066]; figures 1,5 *

TW 201 342 765 A (Univ Asia [TW]) Oct. 16, 2013 (Oct. 16, 2013) * abrégé *.

Daqing Hou Ed—Anonymous: "Relay Element Performance During Power System Frequency Excursions", Protective Relay Engineers, 2008 61st Annual Conference for, IEEE, Piscataway, NJ, USA, Apr. 1, 2008 (Apr. 1, 2008), pp. 105-117, XP031249248, ISBN: 978-1-4244-1949-4 * p. 108, alinéa III—p. 111, alinéa III.B; figures 8,10,12 *.

Gabriel Benmouyal et al: "Concurrent Implementation of 81 Frequency Elements Together With Frequency Tracking in Protective Relays: Issues and Solutions Concurrent Implementation of 81 Frequency Elements Together With Frequency Tracking in Protective Relays: Issues and Solutions", 36th Annual Western Protective Relay Conference Spokane, Oct. 20, 2009 (Oct. 20, 2009), XP055337330, Extrait de l'Internet: URL:https://cdn.selinc.com/assets/Literature/Publications/TechnicalPapers/6383_CurrentImplementation_GB-ADA_20090918_Web.pdf?v=20151125-101029 [extrait le Jan. 20, 2017] * le document en entier *.

US 2009/254291 A1 (Benmouyal Gabriel [CA]) Oct. 8, 2009 (Oct. 8, 2009) * abrégé; figures 2-6 * * alinéas [0010], [0012], [0014], [0018]-[0019], [0022], [0025]-[0028], [0030]-[0033], [0037], [0047]-[0048], [0051]-[0056] *.

EP 1 847 838 A1 (Fondazione Torino Wireless [IT]; Torino Politecnico [IT]; IST Superior) Oct. 24, 2007 (Oct. 24, 2007) * abrégé; figure 4 * * alinéas [0010]-[0013], [0015]-[0017], [0024]-[0029]; revendication 1 *.

U.S. Pat. No. 4,928,251 A (Marzalek Michael S [US] et al) May 22, 1990 (May 22, 1990) * colonne 4, ligne 44—colonne 5, ligne 27; figure 2 *.

* cited by examiner

DETERMINING THE FREQUENCY OF AN ALTERNATING SIGNAL

TECHNICAL FIELD

The present invention relates to the determination of the frequency of an alternating electric signal and, where necessary, the determination of the rate of change of this frequency.

This determination is, for example, implemented in an electrical protective relay or electrical distribution network telecontrol equipment. A protective relay is intended to protect individuals and equipment of an electrical network. Telecontrol equipment is intended to provide, in the substations, measurements and operations for monitoring/control in a remote manner, thanks to appropriate communication means. To provide these functions, the relay or the telecontrol equipment must display phase and amplitude accuracy, which means in particular that the frequency of the alternating electric current of the apparatus to be protected must be determined with accuracy.

PRIOR ART

The operation of the majority of the digital protective relays or of the telecontrol equipment is based on a calculation of the discrete Fourier transform (DFT) of a time signal in order to only extract the fundamental component of the signal (1st harmonic). This time signal represents an electric current or an electric voltage.

The discrete Fourier transform calculation assumes that the time signal is pre-sampled.

In order to provide the best possible accuracy in terms of amplitude, angles, but also in terms of measuring frequency and measuring the electric signal frequency rate of change, the sampling frequency must be synchronous with the frequency of the electric signal. In other words, the sampling frequency must be a multiple of the frequency of the signal. This synchronization is called sampling frequency automatic control.

This Fourier transform calculating method encounters the accuracy limits thereof when the sampling frequency is not synchronous with the frequency of the alternating electric signal. For example, the power supply network has a theoretical frequency of 50 Hz+/−0.5 Hz in France under normal operating conditions. This theoretical frequency is the representation of the balance between production and consumption. In practice, the frequency actual value fluctuates continuously in this admissible bandwidth, but can, in certain situations, display greater variations. It is necessary to take into account all of these fluctuations, both for the management of the network and for the utilization of the measurements undertaken by the equipment on the network.

Moreover, during some transitional phases, the variations with respect to the nominal value can be even greater, for example when a generator is in start phase or when some high-power loads, such as in the electro-intensive industry, are applied.

It is known to calculate the frequency of an electrical quantity, particularly a network voltage or current, on the basis of the angular deviation between two phasors calculated at different instants, i.e. offset by a given duration. This technique is known under the name of phasor methods. The phasors are, preferably, voltage phasors or, alternatively, intensity phasors. This angular deviation is the representation of the frequency of the electrical quantity. This method is based on the calculation of the DFT, which is already calculated in the relay for the protective functions or in the telecontrol equipment for measuring functions.

Yet, when the frequency of the electrical quantity is modified, for example following a modification of the production/consumption balance, the sampling frequency is modified such that it remains synchronous with the frequency of the electrical quantity. During the sampling frequency changes, the calculation of the frequency and of the frequency rate of change is wrong for a transitional period, since the phasors are themselves wrong. These wrong values are detrimental to the protective functions or to those of the telecontrol equipment which require an increasingly greater accuracy. These wrong values must therefore be removed, at the risk of having a detrimental effect on the times for triggering the frequency and frequency rate-of-change protections or of having a detrimental effect on the measurements of voltage, current, power or energy passing through the substation where the telecontrol equipment is located. Furthermore, the sampling frequency automatic control, based on the calculation of the frequency of the electric current, is also wrong when the sampling frequency is updated.

DISCLOSURE OF THE INVENTION

The aim of the invention is to solve the problems of the prior art by providing a method for determining the frequency of an alternating input signal, including the steps of:

sampling the input signal at a first sampling frequency, a first calculation and a first angular comparison of two phasors representing the input signal at two respective instants offset by a predetermined duration, as a function of the input signal sampled at the first sampling frequency, estimating the frequency of the input signal as a function of the result of the angular comparison of the two calculated phasors, characterized in that it further includes the steps of:

storing the input signal, searching for a modification of frequency of the input signal, and in the case of detecting a modification of frequency of the input signal, determining a second sampling frequency, as a function of the modified frequency of the input signal, sampling the stored input signal with the second sampling frequency, over a time window preceding the instant of frequency modification detection, a second calculation and a second angular comparison of two phasors representing the input signal, at two respective instants offset by the predetermined duration, as a function of the input signal sampled at the second sampling frequency and of the stored input signal sampled at the second sampling frequency, estimating the frequency of the input signal as a function of the result of the second angular comparison of the two calculated phasors.

Thanks to the invention, a change in sampling frequency due to the change in the frequency of the alternating electric signal does not have a negative effect on the measurement of the frequency of the alternating electric signal. Indeed, the data taken into account in the calculations, particularly the comparison calculations, is sampled with a same sampling frequency.

According to a preferred feature, the storage of the input signal is performed over a sliding time window of a duration at least equal to the sum of the time offset between two phasors which are compared and of the depth of calculation of a phasor.

According to a preferred feature, searching for a modification of frequency of the input signal includes the calculation of a difference between two successive values of the estimated frequency of the input signal, and the comparison of the calculated difference with a threshold.

According to a preferred feature, the method for determining the frequency of an alternating input signal further includes the calculation of the rate of change of the frequency of the input signal.

According to a preferred feature, the duration predetermined for the calculation and the comparison of two phasors is a half-period of the input signal.

According to a preferred feature, the calculation and the comparison of two phasors are performed every quarter-period of the input signal.

According to a preferred feature, the input signal represents the current or the voltage of a power supply network.

According to another preferred feature, the input signal represents a current or voltage component of a power supply network, this component being the result of a matrix transformation of the current or of the voltage of the power supply network.

The invention also relates to a device for determining the frequency of an alternating input signal, including:

means for sampling the input signal at a first sampling frequency, means for first calculation and first angular comparison of two phasors representing the input signal at two respective instants offset by a predetermined duration, as a function of the input signal sampled at the first sampling frequency, means for estimating the frequency of the input signal as a function of the result of the angular comparison of the two calculated phasors, characterized in that it further includes:

means for storing the input signal, means for searching for a modification of frequency of the input signal, means for determining a second sampling frequency, as a function of the modified frequency of the input signal, in the case of detecting a modification of frequency of the input signal, means for sampling the stored input signal with the second sampling frequency, over a time window preceding the instant of frequency modification detection, means for second calculation and second angular comparison of two phasors representing the input signal, at two respective instants offset by the predetermined duration, as a function of the input signal sampled at the second sampling frequency and of the stored input signal sampled at the second sampling frequency, means for estimating the frequency of the input signal as a function of the result of the second angular comparison of the two calculated phasors.

The invention further relates to a protective relay characterized in that the relay includes the device for determining the frequency of an alternating input signal set out above.

The invention further relates to electrical distribution network telecontrol equipment characterized in that the equipment includes the device for determining the frequency of an alternating input signal set out above.

The device, the relay and the electrical distribution network telecontrol equipment have advantages similar to those set out above.

In a specific embodiment, the steps of the method according to the invention are implemented by computer program instructions.

Consequently, the invention also relates to a computer program on a data medium, wherein this program can be implemented in a computer, this program including instructions suitable for implementing the steps of a method as described above.

This program can use any programming language, and be in the form of source code, object code, or intermediate code between source code and object code, such as in a partially compiled form, or in any other desirable form.

The invention also relates to a data medium that can be read by a computer, and that includes computer program instructions suitable for implementing the steps of a method such as described above.

The data medium can be any entity or device capable of storing the program.

Moreover, the data medium can be a transmissible medium such as an electrical or optical signal, which can be transported via an electrical or optical cable, by radio or by other means. The program according to the invention can be, in particular, downloaded from an Internet-type network.

Alternatively, the data medium can be an integrated circuit in which the program is incorporated, the circuit being suitable for executing or for being used in the execution of the method according to the invention.

BRIEF DESCRIPTION OF THE DRAWINGS

Other features and advantages will emerge upon reading the following description of a preferred embodiment, given by way of nonlimiting example, described with reference to the figures, in which.

DETAILED DISCLOSURE OF SPECIFIC EMBODIMENTS

Figure 1:
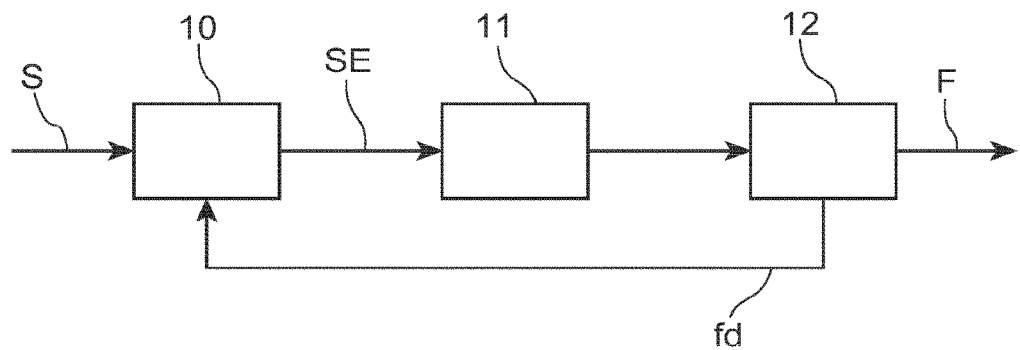
FIG. 1 shows a device for determining the frequency of an alternating electric signal according to the prior art.

FIG. 1 shows a device for determining the frequency of an alternating electric signal according to the prior art. This device is, for example, implemented in a protective relay.

The protective relays for protecting individuals and equipment of a power supply network must display phase and amplitude accuracy.

Only the elements useful for understanding the invention will be described.

The device for determining the frequency of an alternating electric signal includes an input for receiving an input signal S in the form of a digital signal sampled at a given sampling frequency, for example 4800 Hz. The digital signal is an electric current alternating signal, or an electric voltage alternating signal.

In an alternative, the sampling frequency of the signal may vary.

According to another alternative, the processing which will be described is performed on a previously transformed signal. For example, in a multiphase system, a matrix representation of the signals is used with a Clarke, Park or Fortescue transformation. The considered signal then represents a current or voltage component of a power supply network, this component being the result of a matrix transformation of the current or of the voltage of the power supply network.

The input of the device is connected to a downsampling module 10 which downsamples the input signal S that it receives. The frequency of the downsampling is automatically controlled and allows for changing from a digital signal sampled at a given sampling frequency, for example 4800 Hz, to a re-sampled digital signal SE including a determined number of points, for example 48, per period of the input signal. The downsampling frequency fd is dependent upon the frequency of the input signal. These two frequencies are said to in line if the downsampling frequency makes it possible to obtain the desired number of points per period of the input signal. This downsampling, or resampling, makes it possible to form the signal SE that can be processed by the following modules.

An output of the downsampling module 10 is connected to an input of a module 11 for Fourier transform calculation on the resampled signal SE. The module 10 delivers, to the module 11, the resampled alternating digital signal SE including, for example, 48 points per period. The module 11 performs Fourier transform calculations on the resampled signal SE.

An output of the module 11 is connected to an input of a module 12 for calculation of frequency of the input signal S. The module 12 determines the frequency F of the input signal S by tracking two phasors offset by a given duration. This calculation is based on the Fourier transform calculations carried out by the module 11. The tracking of the two phasors determines an angular deviation which is the representation of the frequency of the input signal S.

In fact, the angular deviation is an indicator with regard to the alignment between input signal frequency and downsampling frequency: the aim is for the angular deviation to be equal to the theoretical angle corresponding to the given duration separating the two phasors, for example 180° if two phasors have been chosen which are separated by a half-period. If the angular deviation is different to this theoretical angle, then this indicates that the input signal frequency and downsampling frequency are no longer in line.

For example, the calculation of the Fourier transform of the input signal is performed every quarter-period of the input signal and the angular comparison of the two phasors is performed on two phasors offset by a half-period of the input signal, therefore on two phasors which are theoretically in phase opposition. The phasors are calculated over a depth of a period of the input signal.

Thus, the module 12 has an output which provides the frequency F of the input signal S.

The module 12 has another output connected to an input of the downsampling module 10.

The module 12 compares the current value of the frequency of the input signal with the previous value. In the case of modification of this frequency, the module 12 provides a modified value of downsampling frequency fd to the module 10. Indeed, as disclosed above, the downsampling frequency fd is dependent upon the frequency F of the input signal S, since in all cases, a digital signal including 48 points per period must be output from the module 10.

When the downsampling frequency fd is modified, the calculations for determining the frequency F of the input signal S are performed using pre-sampled signal values according to two different downsampling frequencies for a transitional period equal to the sum of the time offset between two phasors which are compared and of the depth of calculation of a phasor. According to the described example, this transitional period has a length of one and a half periods of the input signal S.

During this transitional period, the angle difference between phasors includes an error, and consequently the measurement of frequency F of the input signal S also includes an error. It should be further noted that, if a calculation of the rate of change of the frequency of the input signal is performed, it also includes an error. The error on the rate of change is greater than that on the frequency itself. In particular, the error on the rate of change of the frequency lasts longer than the error on the frequency. Indeed, the duration of the error on the rate of change is the sum of the duration of the error on the frequency (1.5 period in this case), and of the time offset existing between the two frequencies used to calculate the rate of change.

Figure 2:
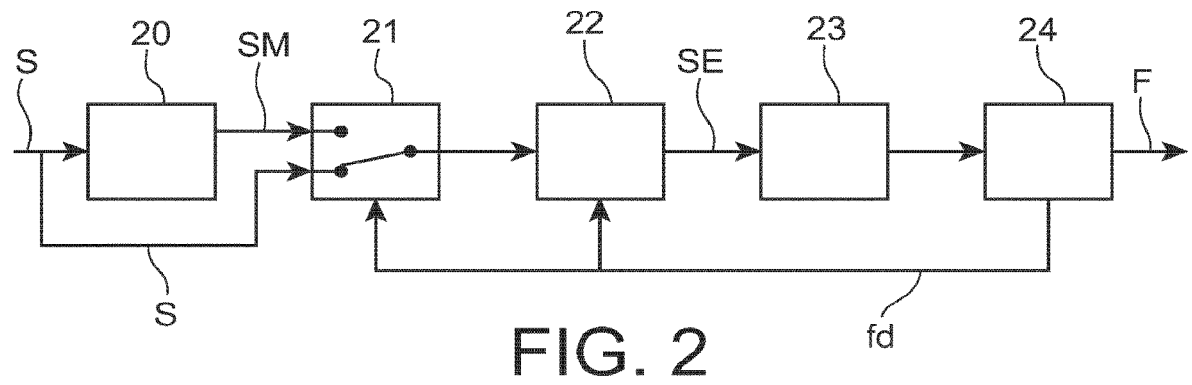
FIG. 2 shows a device for determining the frequency of an alternating electric signal according to an embodiment of the present invention.

According to a preferred embodiment of the present invention, shown in FIG. 2, a device for determining the frequency of an alternating electric signal includes an input for receiving an input signal S in the form of a periodic digital signal sampled at a given sampling frequency, for example 4800 Hz. The input signal S represents an alternating electric signal, which can be an alternating electric current, or an alternating electric voltage. The aim is to precisely determine the frequency F of this alternating electric signal.

In an alternative, the sampling frequency of the signal can vary.

The input of the device is connected firstly to a memory 20 and secondly to an input of a switch 21. The memory 20 has an output connected to another input of the switch 21. The function of the switch 21 will be disclosed hereafter.

The memory 20 is a FIFO (First In First Out)-type buffer and the function thereof is to store the input digital signal S over a sliding time window which is at least equal to the sum of the time offset between two phasors which are compared and of the depth of calculation of a phasor.

An output of the switch 21 is connected to an input of the downsampling module 22 which downsamples the digital signal that it receives, either the input signal S, or the stored input signal SM. The frequency of the downsampling is automatically controlled and allows for moving from a digital signal sampled at a given sampling frequency, for example 4800 Hz, to a resampled digital signal SE, for example including 48 points per period. The downsampling frequency fd is dependent upon the frequency F of the alternating electric signal, such that the module 22 delivers a resampled alternating digital signal SE including a determined number of points per period, for example 48 points per period.

In an alternative, the module 22 is an interpolation and downsampling module which carries out a linear interpolation on the digital signal that it receives, and then a downsampling of the interpolated signal. In this case, the module 22 delivers a resampled alternating digital signal including a determined number of points per period, for example 48 points per period, but the points can be different, both in terms of amplitude and from a temporal perspective, to the points of the input digital signal. Of course, other types of interpolation can be envisaged.

An output of the module 22 is connected to an input of a module 23 for discrete Fourier transform calculation on the resampled signal SE. The module 22 therefore delivers, to the module 23, the resampled alternating digital signal SE, including a determined number of points per period, for example 48 points per period. The module 23 performs Fourier transform calculations on the signal that it receives.

An output of the module 23 is connected to an input of a module 24 for calculating frequency F of the input signal S. The module 24 determines the frequency of the input signal by tracking two phasors offset by a given duration. This calculation is based on the Fourier transform calculations carried out by the module 23. The tracking of the two phasors determines an angular deviation which is the representation of the frequency F of the input signal. This calculation is conventional and is not described in detail here.

In fact, the angular deviation is an indicator on the alignment between input signal frequency and downsampling frequency: the aim is for the angular deviation to be equal to the theoretical angle corresponding to the given duration separating the two phasors, for example 180° if two phasors have been chosen which are separated by a half-period. If the angular deviation is different to this theoretical angle, then this indicates that the input signal frequency and downsampling frequency are no longer in line.

For example, the calculation of the Fourier transform of the input signal is performed every quarter-period of the input signal and the angular comparison of the two phasors is performed on two phasors offset by a half-period of the input signal, therefore on two phasors which are theoretically in phase opposition. The phasors are calculated over a depth of a period of the input signal.

The module 24 thus has an output which provides the frequency F of the alternating electric signal S. In an alternative, the module 24 calculates the first rate of change and possibly the successive rates of change of the frequency of the signal, using conventional calculations.

The module 24 has another output connected to an input of the downsampling module 22. A module 24 compares the current value of the frequency of the alternating electric signal with the previous value. Two values are considered to be identical if the difference thereof is less than a predetermined threshold. In the case of modification of this frequency, the module 24 provides a modified value of downsampling frequency fd to the module 22. Indeed, the downsampling frequency is dependent upon the frequency of the input signal since the aim of the module 22 is to deliver a signal having a given number of points per period of the input signal.

Figure 3A:
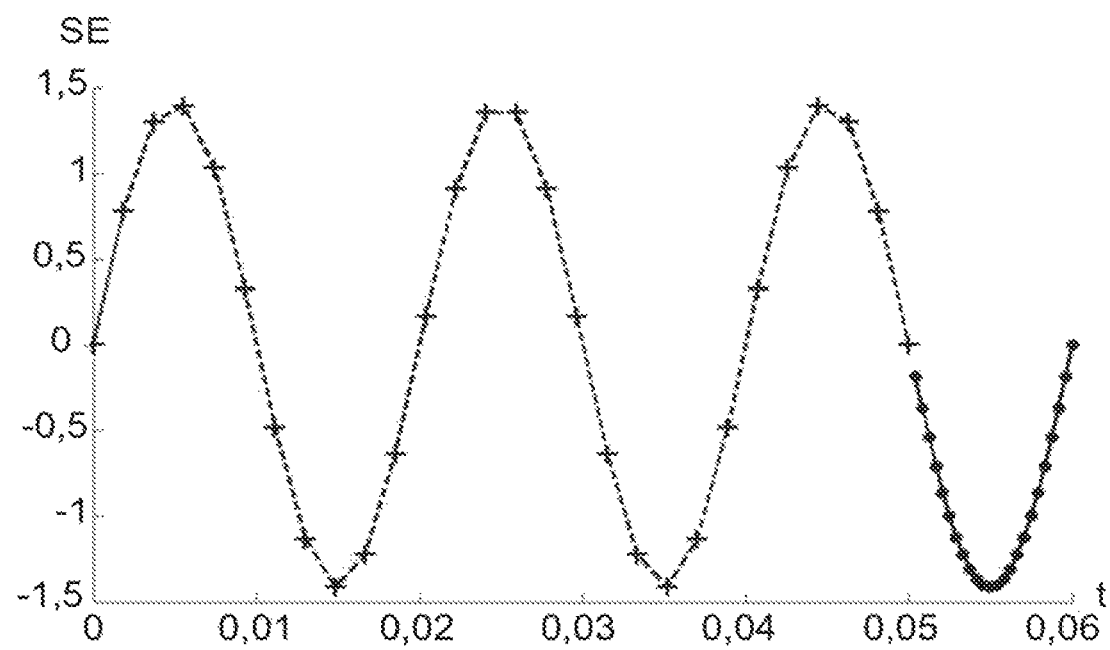
FIG. 3*a* shows a signal sampled before implementing the invention.

FIG. 3a schematically shows the resampled signal SE output from the downsampling module 22, prior to utilization of the stored signal SM. Between the instants t=0 and t=0.05 s, the signal is resampled with a first downsampling frequency, which produces a series of points represented by crosses.

At the instant t=0.05 s, the module 24 for calculating frequency of the input signal determines that the frequency F of the signal is modified. The downsampling frequency fd is modified as a result. The signal is then resampled with a second downsampling frequency, starting from the instant t=0.05 s, which produces a series of points represented by circles. It is assumed in this case that the stored input signal SM has not yet been utilized.

It should be noted that, to more clearly show the change in downsampling frequency, the downsampling frequencies before and after the instant t=0.05 s have been chosen to be extremely different in FIG. 3a.

Figure 3B:
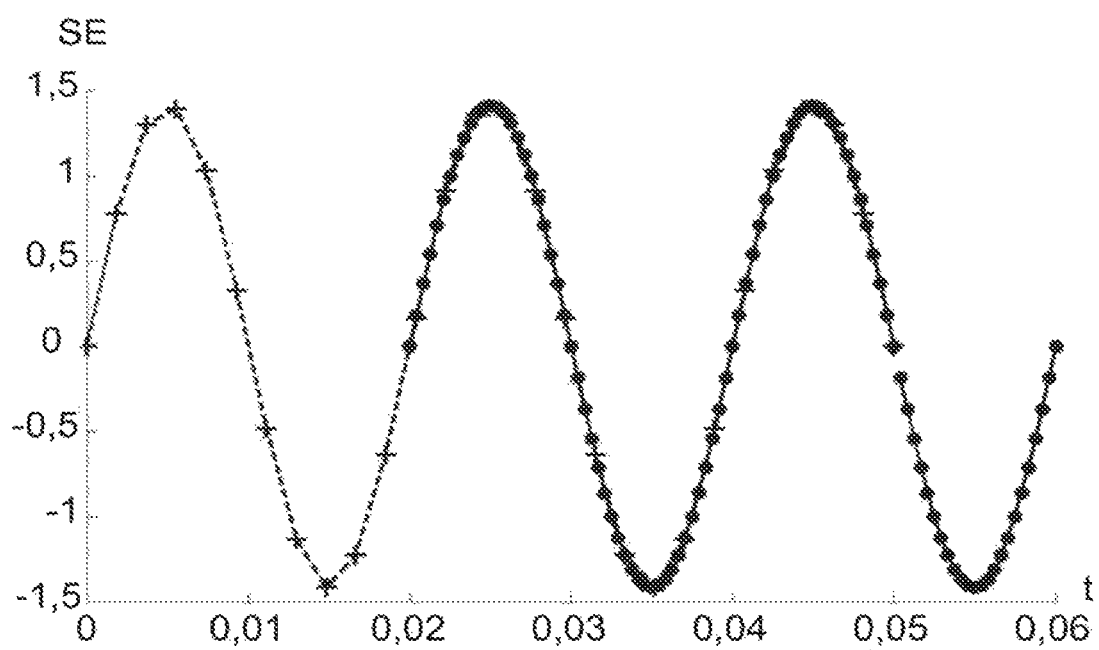
FIG. 3*b* shows a signal sampled after implementing the invention.

FIG. 3b schematically shows the resampled signal output from the downsampling module 22, still with a change in input signal frequency at t=0.05 s, but, on this occasion, after utilization of the stored input signal SM.

When the downsampling frequency is modified, the switch 21 is controlled such as to connect the memory 20 to the downsampling module 22. Downsampling is then carried out on the stored signal SM, but with the new downsampling frequency value. The stored signal is the input digital signal, over a duration at least equal to the sum of the time offset between two phasors which are compared and of the depth of calculation of a phasor, namely, in the described example, at least one and a half periods. Downsampling is therefore performed retroactively, on at least one and a half periods of the input signal starting from the instant t=0.05 seconds.

Thus, the tracking of the two phasors is performed on the basis of data representing the input signal resampled at a same sampling frequency and the frequency of the input signal which is determined by the module 24 is correctly calculated.

When the stored input signal SM has replaced the input signal S over a duration corresponding to the time window of the memory 20, and the frequency F measured by the module 24 is stable, the switch 21 is switched and the signal S is again input to the module 22.

Figure 4A:
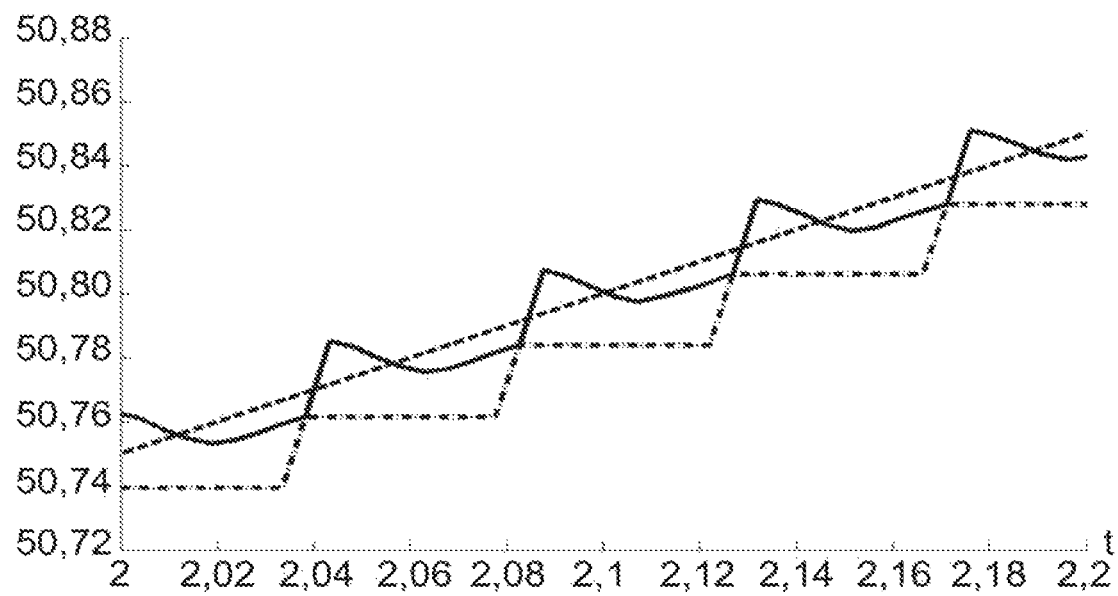
FIG. 4*a* shows an example of variation of the frequency of the alternating electric signal, according to the prior art.

FIG. 4a shows an example of variation of the frequency of the alternating electric signal, according to the prior art. In this example, the actual frequency of the alternating signal varies linearly along a slope of 0.5 Hz per second, for the purposes of the demonstration. It is shown by a broken straight line.

The frequency of downsampling by a multiplication factor is substantially step-like. It is shown in alternating line.

The measured frequency of the alternating electric signal is shown in continuous line. It is noted that the result of each change in downsampling frequency is that the measured frequency of the alternating electric signal is wrong over approximately one and a half periods of the electric signal.

Figure 4B:
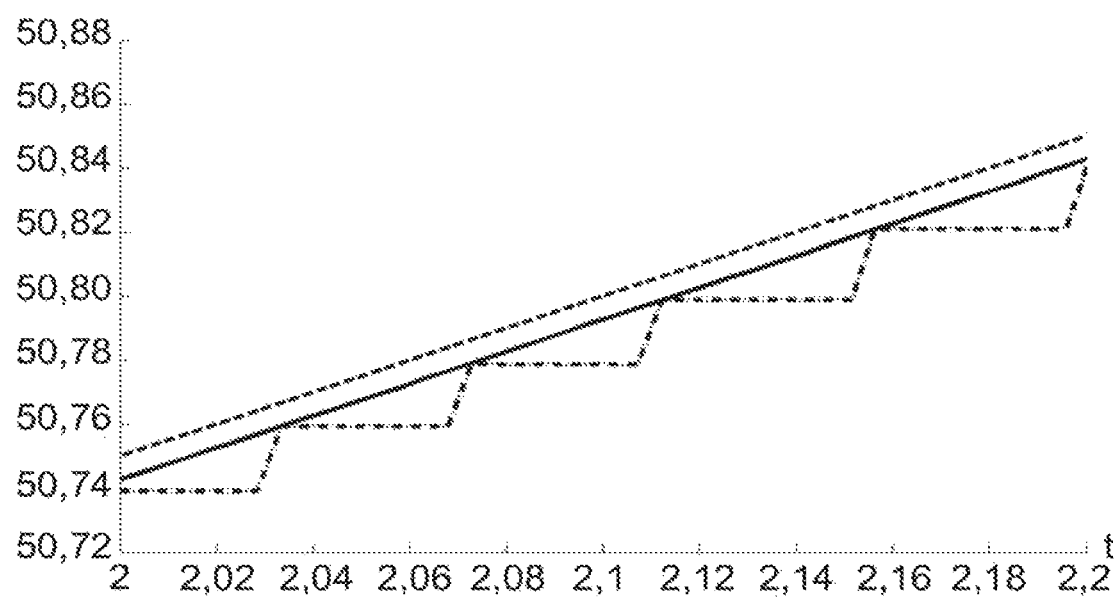
FIG. 4*b* shows an example of variation of the frequency of the alternating electric signal, according to the present invention.

FIG. 4b shows an example of variation of the frequency of the alternating electric signal, according to the present invention. For the purposes of comparison with the previous figure, in this case also the actual frequency of the alternating signal varies linearly along a slope of 0.5 Hz per second. It is shown by a broken straight line.

The frequency of downsampling by a multiplication factor is substantially step-like. It is shown in alternating line.

The measured frequency of the alternating electric signal is shown in continuous line. It is noted that it varies linearly like the actual frequency of the alternating signal and that it follows the same slope as the actual frequency of the alternating signal.

Figure 5A:
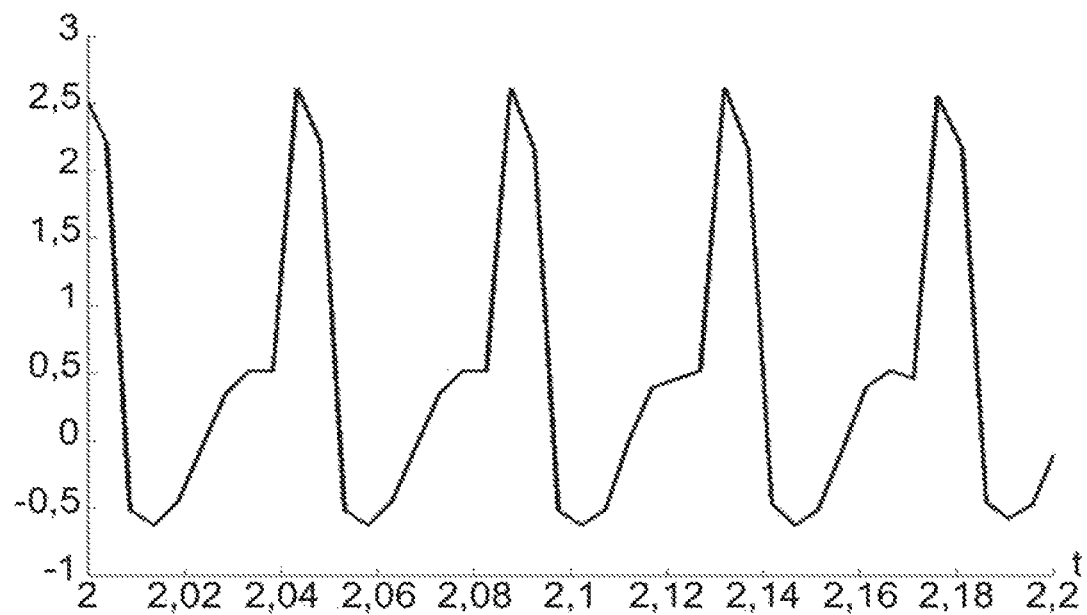
FIG. 5*a* shows an example of variation of the rate of change of the frequency of the alternating electric signal, according to the prior art.

FIG. 5a shows an example of variation of the rate of change of the frequency of the alternating electric signal, according to the prior art. It is the rate of change of the frequency shown in FIG. 4a.

Figure 5B:
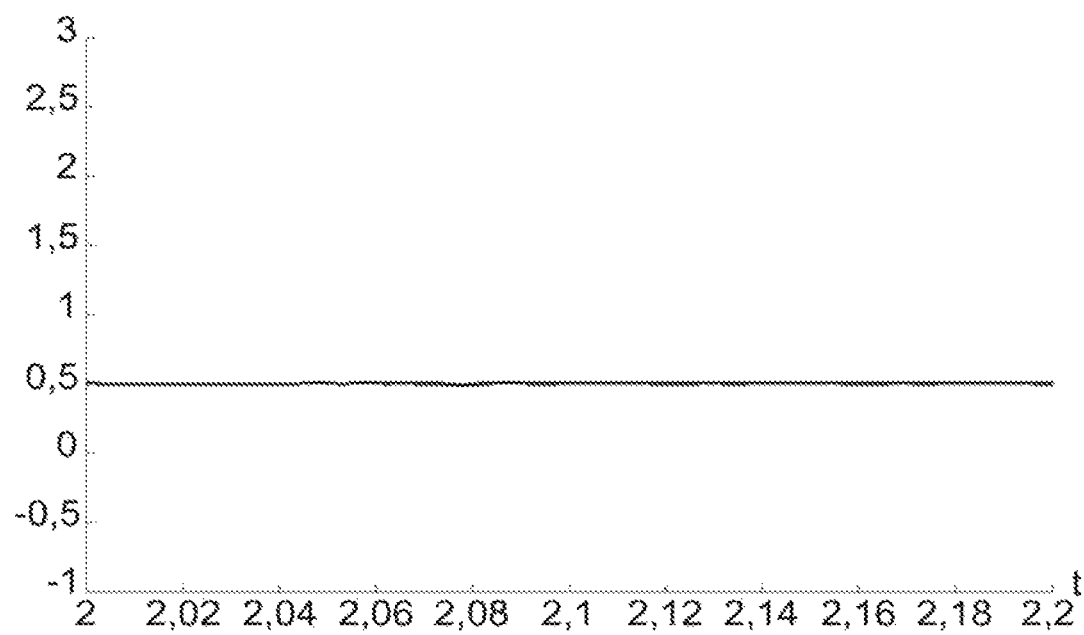
FIG. 5*b* shows an example of variation of the rate of change of the frequency of the alternating electric signal, according to the present invention.

FIG. 5b shows an example of variation of the rate of change of the frequency of the alternating electric signal, according to the present invention. It is the rate of change of the frequency shown in FIG. 5a.

Figure 6:
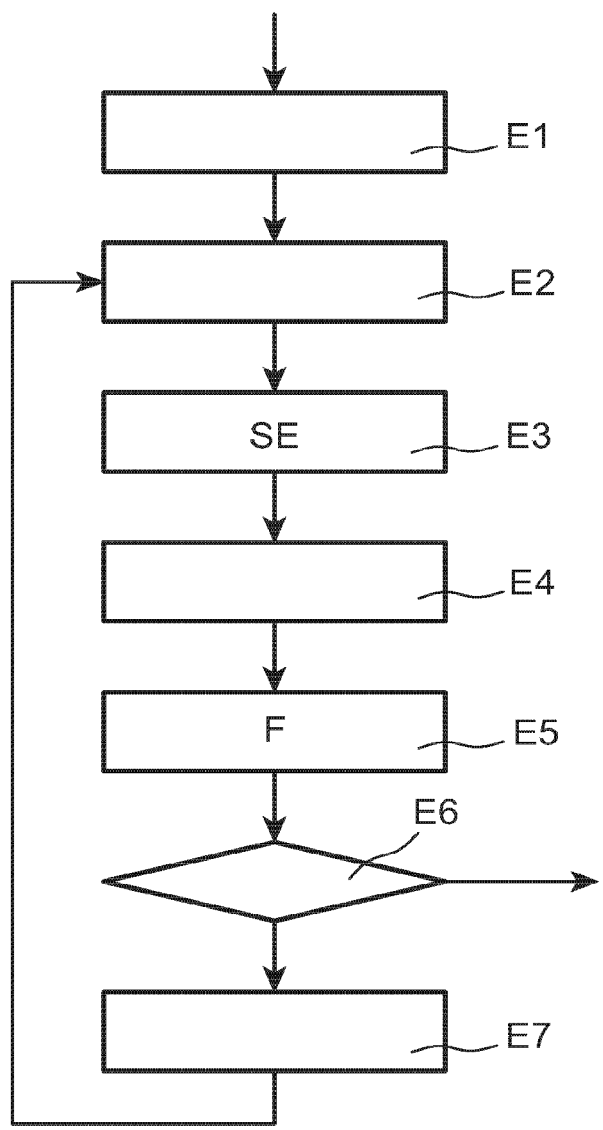
FIG. 6 shows a method for determining the frequency of an alternating electric signal according to an embodiment of the present invention.

FIG. 6 shows the operation of the device for determining the frequency of an alternating electric signal, as a flow diagram including steps E1-E7.

The step E1 is the storage, in a FIFO (First In First Out)-type buffer, of the input digital signal S over a sliding time window which is at least equal to the sum of the time offset between two phasors which are compared and of the depth of calculation of a phasor.

The following step E2 is a selection of a signal to be processed. As detailed below, the signal to be processed is either the input digital signal S, or the stored signal SM. By default, the signal to be processed is the input digital signal S.

The following step E3 is a downsampling of the digital signal selected at the previous step. The downsampling frequency fd is dependent upon the frequency F of the alternating electric signal S, such that the step E3 results in a resampled alternating digital signal SE including a determined number of points per period, for example 48 points per period.

In an alternative, the step E3 is a linear interpolation on the digital signal selected in the previous step and then a downsampling of the interpolated signal. In this case, the result of the step E3 is a resampled alternating digital signal including a determined number of points per period, for example 48 points per period, but the points can be different to the points of the original digital signal. Of course, other types of interpolation can be envisaged.

The following step E4 is a discrete Fourier transform calculation on the signal resampled at the previous step.

The following step E5 is a calculation of frequency F of the input signal S. The frequency of the input digital signal is determined by tracking two phasors offset by a given duration. This calculation is based on the Fourier transform calculations carried out at the previous step. The tracking of the two phasors determines an angular deviation which is the representation of the frequency of the input digital signal.

For example, the Fourier transform calculation for the input digital signal is performed every quarter-period of the digital signal and the angular comparison of the two phasors is performed on two phasors offset by a half-period of the digital signal, therefore on two phasors which are theoretically in phase opposition. The phasors are calculated over a depth of a period of the digital signal.

The step E5 results in the frequency F of the input signal S. In an alternative, the step E5 also includes the calculation of the first rate of change and possibly of the successive rates of change of the frequency of the input signal, using conventional calculations.

The following step E6 is a test to determine if the current value of the frequency of the input signal is identical or not to the previous value. Two values are considered to be identical if the difference thereof is less than a predetermined threshold.

If the current value of the frequency of the alternating electric signal S is identical to the previous value, then the processing continues without modification.

If the current value of the frequency of the alternating electric signal S is different to the previous value, then the step E6 is followed by the step E7 at which a downsampling frequency modified value replaces the downsampling frequency current value. Indeed, the downsampling frequency is dependent upon the frequency of the input digital signal since the aim of the step E3 is to deliver a signal having a given number of points per period of the input signal.

The step E7 is followed by the step E2 at which the selected signal is, on this occasion, the stored signal SM.

The step E2 is then followed by the step E3, at which the downsampling is carried out on the stored signal SM, with the downsampling frequency modified value. The stored signal is the input digital signal, stored over a duration at least equal to the sum of the time offset between two phasors which are compared and of the depth of calculation of a phasor, namely, in the example described, at least one and a half periods of the input digital signal S. Downsampling is therefore performed retroactively, over one and a half periods of the input signal.

Thus, the tracking of the two phasors is performed using data representing the signal at a same sampling frequency and the frequency of the input signal which is determined at the step E5 is correctly calculated.

When the stored signal SM has replaced the input signal S over a duration corresponding to the time window of the memory 20, and the frequency F determined at the step E5 is stable, the input signal S is again selected at the step E2.

The previously described steps E1-E7 are repeated in a loop, such that, for example, the Fourier transform calculations are performed every quarter-period of the input signal and the tracking of phasors is performed every half-period of the input signal.

It should be noted that the additional calculations performed on the stored input signal do not introduce a delay in the response of the system from an external perspective. Indeed, the times for additional calculations are small, for example with respect to the period of an electric network current. In practice, the calculated frequency of the input signal is published once per period, whereas, as seen above, the calculations are performed every quarter-period. It is possible to publish the calculated frequency of the input signal every half-period or every quarter-period, without introducing a delay. The same applies to the rates of change of the frequency.

Figure 7:
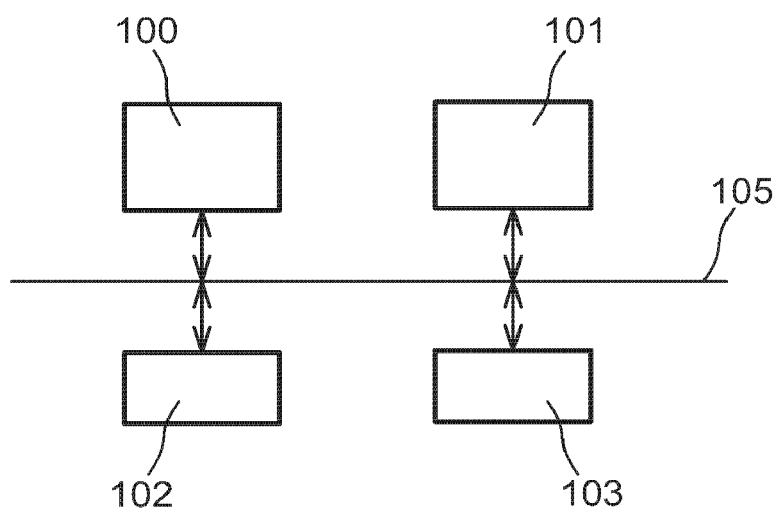
FIG. 7 shows an embodiment of the device for determining the frequency of an alternating electric signal according to the present invention.

FIG. 7 shows a specific embodiment of a device for determining the frequency of an alternating electric signal, according to the invention.

The device for determining the frequency of an alternating electric signal has the general structure of a computer. In particular, it includes a processor 100 executing a computer program implementing the method according to the invention, a memory 101, an input interface 102 and an output interface 103.

These various elements are conventionally connected by a bus 105.

The input interface 102 is connected to conventional means for measuring an electric signal and is intended to receive the input signal.

The processor 100 executes the previously disclosed processing. This processing is carried out in the form of code instructions of the computer program, which are stored by the memory 101 before being executed by the processor 100.

The memory 101 further stores the input signal.

The output interface 103 delivers the frequency of the input signal.

The invention claimed is:

1. A method for determining a frequency of an alternating input signal, the method comprising:

sampling the input signal at a first sampling frequency;

performing first calculation and first angular comparison of two phasors representing the input signal, at two respective instants offset by a predetermined duration, as a function of the input signal sampled at the first sampling frequency;

estimating the frequency of the input signal as a function of a result of the angular comparison of the two calculated phasors;

storing the input signal;

detecting whether a modification of frequency of the input signal has occurred by determining whether a difference between two successive values of the estimated frequency of the input signal has exceeded a predetermined threshold;

determining, in response to detecting that the modification of frequency of the input signal has occurred when the difference between the two successive values exceeds the predetermined threshold, a second sampling frequency, as a function of the modified frequency of the input signal;

sampling, in response to detecting that the modification of frequency of the input signal has occurred when the difference between the two successive values exceeds the predetermined threshold, the stored input signal with the second sampling frequency, over a time window preceding an instant of frequency modification detection;

performing, in response to detecting that the modification of frequency of the input signal has occurred when the difference between the two successive values exceeds the predetermined threshold, second calculation and second angular comparison of two phasors representing the input signal, at two respective instants offset by the predetermined duration, as a function of the input signal sampled at the second sampling frequency and of the stored input signal sampled at the second sampling frequency; and estimating, in response to detecting that the modification of frequency of the input signal has occurred when the difference between the two successive values exceeds the predetermined threshold, the frequency of the input signal as a function of a result of the second angular comparison of the two calculated phasors.

2. The method for determining the frequency of an alternating electric signal according to claim 1, wherein the storing of the input signal is performed over a sliding time window of a duration at least equal to a sum of a time offset between two phasors which are compared and of a depth of calculation of a phasor.

3. The method for determining the frequency of an alternating electric signal according to claim 1, wherein the detecting of the modification of frequency of the input signal includes calculation of the difference between the two successive values of the estimated frequency of the input signal, and comparison of the calculated difference with the predetermined threshold.

4. The method for determining the frequency of an alternating electric signal according to claim 1, further comprising calculating a rate of change of the frequency of the signal.

5. The method for determining the frequency of an alternating electric signal according to claim 1, wherein the predetermined duration for the first or second calculation and the first or second comparison of two phasors is a half-period of the input signal.

6. The method for determining the frequency of an alternating electric signal according to claim 1, wherein the first or second calculation and the first or second comparison of two phasors are performed every quarter-period of the input signal.

7. The method for determining the frequency of an alternating electric signal according to claim 1, wherein the input signal represents a current or a voltage of a power supply network.

8. The method for determining the frequency of an alternating electric signal according to claim 1, wherein the input signal represents a current or voltage component of a power supply network, the current or the voltage component being a result of a matrix transformation of the current or of the voltage of the power supply network.

9. A non-transitory computer-readable storage medium including computer executable instructions, wherein the instructions, when executed by a computer, cause the computer to perform the method according to claim 1.

10. A device for determining a frequency of an alternating input signal, the device comprising:

circuitry configured to sample the input signal at a first sampling frequency, perform first calculation and first angular comparison of two phasors representing the input signal at two respective instants offset by a predetermined duration, as a function of the input signal sampled at the first sampling frequency, estimate the frequency of the input signal as a function of a result of the angular comparison of the two calculated phasors, store the input signal, detect whether for a modification of frequency of the input signal has occurred by determining whether a difference between two successive values of the estimated frequency of the input signal has exceeded a predetermined threshold, determine, in response to detecting that the modification of frequency of the input signal has occurred when the difference between the two successive values exceeds the predetermined threshold, a second sampling frequency, as a function of the modified frequency of the input signal, sample, in response to detecting that the modification of frequency of the input signal has occurred when the difference between the two successive values exceeds the predetermined threshold, the stored input signal with the second sampling frequency, over a time window preceding an instant of frequency modification detection, perform, in response to detecting that the modification of frequency of the input signal has occurred when the difference between the two successive values exceeds the predetermined threshold, second calculation and second angular comparison of two phasors representing the input signal, at two respective instants offset by the predetermined duration, as a function of the input signal sampled at the second sampling frequency and of the stored input signal sampled at the second sampling frequency, and estimate, in response to detecting that the modification of frequency of the input signal has occurred when the difference between the two successive values exceeds the predetermined threshold, the frequency of the input signal as a function of a result of the second angular comparison of the two calculated phasors.

11. A protective relay comprising the device for determining the frequency of an alternating input signal according to claim 10.

12. An electrical distribution network telecontrol equipment comprising the device for determining the frequency of an alternating input signal according to claim 10.

* * * * *